United States Patent
Herrmann

(10) Patent No.: US 10,109,780 B2
(45) Date of Patent: Oct. 23, 2018

(54) OPTOELECTRONIC COMPONENT AND METHOD FOR PRODUCING OPTOELECTRONIC SEMICONDUCTOR COMPONENTS

(71) Applicant: OSRAM Opto Semiconductors GmbH, Regensburg (DE)

(72) Inventor: Siegfried Herrmann, Neukirchen (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 17 days.

(21) Appl. No.: 15/127,401

(22) PCT Filed: Mar. 17, 2015

(86) PCT No.: PCT/EP2015/055543
§ 371 (c)(1),
(2) Date: Sep. 19, 2016

(87) PCT Pub. No.: WO2015/140159
PCT Pub. Date: Sep. 24, 2015

(65) Prior Publication Data
US 2017/0133566 A1    May 11, 2017

(30) Foreign Application Priority Data

Mar. 20, 2014  (DE) .................. 10 2014 103 828

(51) Int. Cl.
*H01L 33/62*   (2010.01)
*H01L 33/38*   (2010.01)
(Continued)

(52) U.S. Cl.
CPC ............ *H01L 33/62* (2013.01); *H01L 23/043* (2013.01); *H01L 23/36* (2013.01); *H01L 23/498* (2013.01);
(Continued)

(58) Field of Classification Search
CPC ..... H01L 25/167; H01L 33/48; H01L 33/483; H01L 33/486; H01L 33/62; H01L 23/12;
(Continued)

(56) References Cited

U.S. PATENT DOCUMENTS

2012/0074441 A1    3/2012  Seo et al.
2012/0223416 A1    9/2012  Scheubeck et al.
(Continued)

FOREIGN PATENT DOCUMENTS

CN       103311261 A      9/2013
DE    10 2011 017 097 A1   10/2012
(Continued)

OTHER PUBLICATIONS

Cree, Inc., "Direct Attach DA3547TM LEDs" Datasheet CPR3EL Rev. D. pp. 1-5, 2012.

*Primary Examiner* — Thanhha Pham
(74) *Attorney, Agent, or Firm* — McDermott Will & Emery LLP

(57) ABSTRACT

What is specified is: an optoelectronic semiconductor component (1) comprising a carrier (5) and a semiconductor body (2), wherein the semiconductor body is fastened on the carrier and has a semiconductor layer sequence having an active region (20) provided for generating and/or receiving radiation, a first semiconductor layer (21) and a second semiconductor layer (22). The active region is arranged between the first semiconductor layer and the second semiconductor layer. The carrier is electrically conductive and is divided into a first carrier body (51) and a second carrier body (52), wherein the first carrier body and the second carrier body are electrically insulated from one another. The first carrier body has a first external contact (61) of the semiconductor component on the side remote from the semiconductor body, wherein the first contact is electrically conductively connected to the first semiconductor layer via (Continued)

Figure 1A:
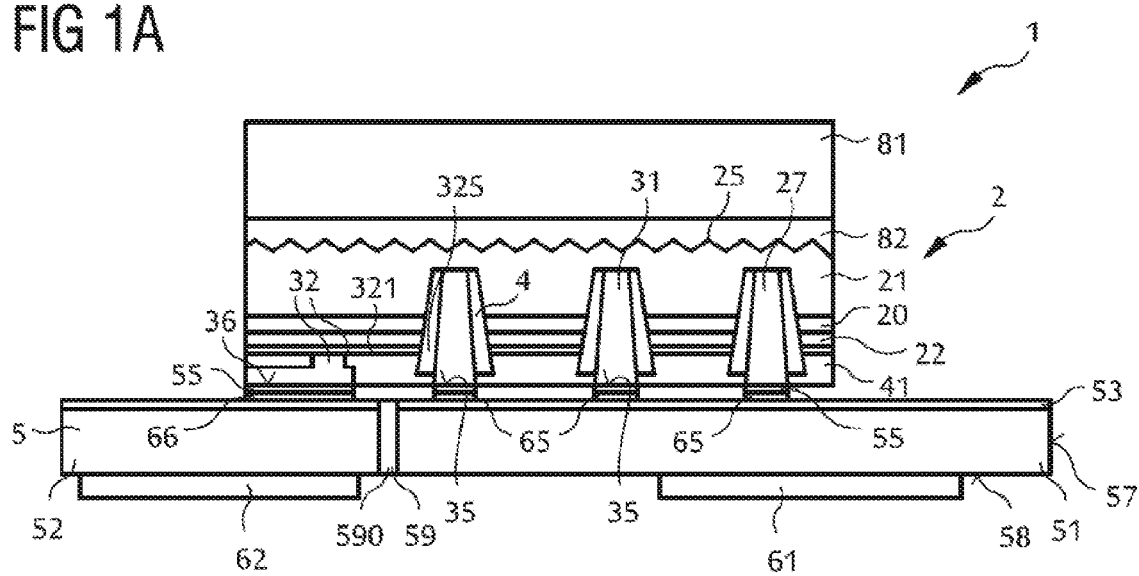

the first carrier body. The second carrier body has a second external contact (62) of the semiconductor component on the side remote from the semiconductor body, wherein the second contact is electrically conductively connected to the second semiconductor layer via the second carrier body. The invention furthermore relates to a method for producing semiconductor components.

9 Claims, 4 Drawing Sheets

(51) Int. Cl.
| | |
|---|---|
| *H01L 33/48* | (2010.01) |
| *H01L 23/12* | (2006.01) |
| *H01L 23/498* | (2006.01) |
| *H01L 25/16* | (2006.01) |
| *H01L 31/02* | (2006.01) |
| *H01L 31/0224* | (2006.01) |
| *H01L 23/043* | (2006.01) |
| *H01L 23/36* | (2006.01) |
| *H01L 33/64* | (2010.01) |

(52) U.S. Cl.
CPC ...... *H01L 23/49833* (2013.01); *H01L 25/167* (2013.01); *H01L 31/02005* (2013.01); *H01L 31/022408* (2013.01); *H01L 33/382* (2013.01); *H01L 33/483* (2013.01); *H01L 33/486* (2013.01); *H01L 33/648* (2013.01); *H01L 2933/0016* (2013.01); *H01L 2933/0066* (2013.01)

(58) Field of Classification Search
CPC ............ H01L 23/498; H01L 23/49833; H01L 23/043; H01L 23/36; H01L 33/64–33/648
See application file for complete search history.

(56) References Cited

U.S. PATENT DOCUMENTS

| | | | |
|---|---|---|---|
| 2013/0187183 A1 | 7/2013 | Hoppel et al. | |
| 2013/0207154 A1* | 8/2013 | Hoppel | H01L 25/167 257/99 |
| 2014/0246648 A1* | 9/2014 | Im | H01L 33/382 257/13 |

FOREIGN PATENT DOCUMENTS

| | | |
|---|---|---|
| DE | 102011103412 A1 | 12/2012 |
| DE | 102012101409 A1 | 6/2013 |
| DE | 102012217533 A1 | 3/2014 |
| DE | 102013111977 A1 | 4/2015 |
| EP | 2533313 A2 | 12/2012 |

* cited by examiner

OPTOELECTRONIC COMPONENT AND METHOD FOR PRODUCING OPTOELECTRONIC SEMICONDUCTOR COMPONENTS

The present application relates to an optoelectronic semiconductor component and a method for producing optoelectronic semiconductor components.

In optoelectronic semiconductor components such as luminescence diodes, miniature designs are desired for various applications, said designs being in particular capable of being contacted without bonding wires. Semiconductor components may be used to that end, the carriers of which are provided with through-connections. However, this approach comes with high manufacturing costs and often times with a low mechanical stability.

One object is to provide an optoelectronic semiconductor component that can be produced in a simple and reliable manner and that is characterized by high mechanical stability. Furthermore, a method is to be provided, by means of which optoelectronic semiconductor components can be produced in an efficient and cost-effective manner.

Inter alia, said objects are achieved by a semiconductor component or a method according to one of the independent claims. Further designs and developments are the subject-matter of the dependent patent claims.

According to at least one embodiment, an optoelectronic component comprises a semiconductor body. The semiconductor body comprises a semiconductor layer sequence, particularly epitaxially, which has been produced by means of MOCVD or MBE, for example.

For example, the semiconductor layer sequence comprises an active region provided for generating and/or receiving radiation. For example, said active region is arranged between a first semiconductor layer and a second semiconductor layer. The first semiconductor layer and the second semiconductor layer are at least sectionally different from one another in terms of the conductor type so that the active region is located in a p-n junction. The first semiconductor layer, the second semiconductor layer and the active region may in each case have a multilayer design.

According to at least one embodiment of the optoelectronic semiconductor component, said semiconductor component comprises a carrier, the semiconductor body being fastened to said carrier. In particular, the carrier is electrically conductive. In particular, the carrier may consist of an electrically conductive material.

According to at least one embodiment of the semiconductor component, the carrier is divided into a first carrier body and a second carrier body. Thus, the first carrier body and the second carrier body form parts of the carrier. In particular, the first carrier body and the second carrier body are configured similarly in terms of the material. The first carrier body and the second carrier body are electrically insulated from one another. For example, the first carrier body and the second carrier body are spaced apart from one another in the lateral direction, i.e. in a direction running along the main extension plane of the semiconductor layers of the semiconductor layer sequence.

According to at least one embodiment of the semiconductor component, the first carrier body comprises a first external contact of the semiconductor component on the side facing away from the semiconductor body. For example, the first contact is electrically conductively connected to the first semiconductor layer via the first carrier body.

According to at least one embodiment of the semiconductor component, the second carrier body comprises a second external contact of the semiconductor component on the side facing away from the semiconductor body. For example, the second contact is electrically conductively connected to the second semiconductor layer.

The first contact and the second contact are provided for the external electrical contacting of the semiconductor component. In particular, both the first contact and the second contact are accessible for an external electrical contacting from the side of the carrier facing away from the semiconductor body. In particular, the semiconductor component is designed as a surface-mounted device (SMD).

The first carrier body and the second carrier body are each electrically conductive per se so that the electrical contacting of the semiconductor component may ensue for both polarities through the material of the carrier. Through-connections through the carrier can be dispensed with.

In a top view of the semiconductor component, preferably both the first carrier body and the second carrier body project above the semiconductor body at least sectionally. In particular, the first carrier body and the second carrier body at least sectionally form the side surface bounding the semiconductor component in the lateral direction.

In at least one embodiment, the optoelectronic semiconductor component comprises a carrier and a semiconductor body, wherein the semiconductor body is fastened to the carrier and comprises an active region provided for generating and/or receiving radiation, a first semiconductor layer and a second semiconductor layer. The active region is arranged between the first semiconductor layer and the second semiconductor layer. The carrier is electrically conductive and divided into a first carrier body and second carrier body, wherein the first carrier body and the second carrier body are electrically insulated from one another. The first carrier body comprises a first external contact of the semiconductor component on the side facing away from the semiconductor body, wherein the first contact is electrically conductively connected to the first semiconductor layer via the first carrier body. The second carrier body comprises a second external contact of the semiconductor component on the side facing away from the semiconductor body, wherein the second contact is electrically conductively connected to the second semiconductor layer via the second carrier body.

The first contact and the second contact may in each case be designed as a coating on the first carrier body or the second carrier body, respectively. However, in contrast, the first contact and the second contact may be regions of the first carrier body or the second carrier body, respectively, on the side of the carrier facing away from the semiconductor body.

For example, the semiconductor body is connected to the carrier via a connection layer, for example a solder layer or an electrically conductive adhesive layer.

According to at least one embodiment of the semiconductor component, the first carrier body and the second carrier body in a top view together cover at least 80% of a base area of the semiconductor component, preferably at least 90%. Thus, a major part of the base area of the semiconductor component is formed by the electrically conductive material of the carrier.

According to at least one embodiment of the semiconductor component, the first carrier body and the second carrier body in a rear view of the semiconductor component together cover at least 80% of the semiconductor body, preferably at least 90%. The higher the coverage of the semiconductor body, the more efficient loss heat generated during operation of said semiconductor component can be dissipated from the semiconductor component.

According to at least one embodiment of the semiconductor component, the first semiconductor layer is arranged in the side of the active region facing away from the carrier. The semiconductor body comprises at least one recess extending through the second semiconductor layer and the active region into the first semiconductor layer. A first connection layer is arranged in the recess, said connection layer being electrically conductively connected to the first semiconductor layer. The recess is surrounded by material of the semiconductor body particularly entirely in the lateral direction. In other words, the recess does not run on the edge of the semiconductor body. Further, the semiconductor body may as well comprise a plurality of recesses. The first semiconductor layer arranged on the side of the active region facing away from the carrier can be electrically contacted by means of said recess. As a result, contact elements applied on the side of the semiconductor body facing away from the carrier for electrical contacting of the first semiconductor layer may be dispensed with.

According to at least one embodiment of the semiconductor component, said semiconductor component comprises a second connection layer, which is connected to the second semiconductor layer in an electrically conductive manner. In particular, the second connection layer comprises a cutout, in which the first semiconductor layer is connected to the first carrier body of the carrier via the first connection layer. For example, the cutout overlaps with the recess of the semiconductor body in a top view of the semiconductor component.

In particular, the second connection layer may comprise a plurality of cutouts, in which the first semiconductor layer is connected to the first carrier body of the carrier via the first connection layer, wherein all cutouts run inside the first carrier body in a top view of the semiconductor component. Thus, the cutouts are arranged without overlapping relative to the second carrier body.

According to at least one embodiment of the semiconductor component, the first carrier body and the second carrier body are separated from one another by an isolation trench. Said isolation trench extends entirely through the carrier in the vertical direction. The first carrier body and the second carrier body do thus not directly adjoin one another at any location. For example, the isolation trench runs between two opposite side surfaces of the carrier 5, in particular continuously from one side surface to the opposite side surface.

According to at least one embodiment of the semiconductor component, the isolation trench is filled with an electrically insulating filler material. For example, the electrically insulating material contains a polymer material such as an epoxide. Filler materials for adjusting the longitudinal expansion coefficient may be added to the electrically insulating material. As an alternative, the isolation trench may be free of solid material.

According to at least one embodiment of the semiconductor component, the carrier, particularly the first carrier body and the second carrier body, is metallic. For example, the carrier contains a metal or a metallic alloy or a compound with at least one metal or consists of such a material. The carrier may contain molybdenum, tungsten, copper, steel, aluminum or iron, for example. Furthermore, the carrier may have a single layer or a multilayer design. The materials mentioned are characterized by high heat conductivity, besides the electric conductivity, so that loss heat generated in the semiconductor body can be efficiently dissipated via the carrier during operation of the semiconductor component.

According to at least one embodiment, the carrier is adjusted to the semiconductor body in terms of the thermal expansion coefficient. In particular, a thermal expansion coefficient of the carrier deviates from the thermal expansion coefficient of the semiconductor body by no more than 50%. As a result, the risk of mechanical stress due to temperature changes is reduced.

According to at least one embodiment of the semiconductor component, said semiconductor component comprises a radiation conversion element. The radiation conversion element is particularly provided for the at least partial conversion of the primary radiation generated during operation in the active region into secondary radiation with a peak wavelength that is different from the peak wavelength of the primary radiation. For example, the semiconductor component may be designed as a component that, during operation, radiates mixed light that appears to be white to the human eye.

In the described semiconductor component, particularly the following effects can be achieved.

The semiconductor component is characterized by high mechanical stability of the side of the semiconductor body on which the carrier is fastened.

The specific arrangement of the first contact and the second contact on the rear side of the semiconductor component can be designed freely within a wide range. Customer-specific requirements may be readily implemented this way.

The electrically conductive carrier is further characterized by good thermal properties so that the loss heat can be dissipated in an efficient and large-area fashion.

Furthermore, the carrier may optionally be provided with a mirror layer, by means of which radiation radiated in the direction of the carrier may be efficiently deflected during operation. Absorption losses on the carrier may be reduced.

Due to the high mechanical stability, the carrier may also stabilize the radiation conversion element mechanically. The radiation conversion element does not have to be designed in a mechanically stable manner per se.

Further, a growth substrate for the epitaxial deposition of the semiconductor layers of the semiconductor layer sequence is not required and may be removed. A semiconductor component with the growth substrate removed is also referred to as a thin film semiconductor component. In contrast, the growth substrate may also remain in the semiconductor component. Thus, the production step for removing the growth substrate may be omitted.

According to at least one embodiment, a method for producing a plurality of semiconductor components comprises a step in which a carrier composite is provided with a plurality of semiconductor body mounting regions. Each semiconductor mounting region comprises at least a first contacting surface and a second contacting surface and an isolation trench is formed in the carrier composite in each semiconductor body mounting region between the first contacting surface and the second contacting surface. The semiconductor body mounting region can also comprise a plurality of first contacting surfaces and/or a plurality of second contacting surfaces. The first contacting surfaces and/or the second contacting surfaces may be arranged on the carrier composite in a matrix-type pattern, for example.

The isolation trench particularly extends in the vertical direction, i.e. perpendicular to the main extension plane of the carrier composite, completely through the carrier composite. In the lateral direction, said isolation trenches only extend sectionally over the carrier composite, so that the isolation trenches do not separate the carrier composite in its entirety. In other words, the carrier composite with the isolation trenches is designed in a continuous manner.

In particular, the carrier composite is free of electrically insulating material for electric insulation between the first contacting surfaces and the second contacting surfaces. Furthermore, the first contacting surfaces and the second contacting surfaces are electrically conductively connected to the carrier composite.

According to at least one embodiment of the method, the method comprises a step in which a plurality of semiconductor bodies is fastened on the semiconductor body mounting regions. A first connection surface of the semiconductor body is electrically conductively connected to the first contacting surface and a second connection surface of the semiconductor body is electrically conductively connected to the second contacting surface. The semiconductor body may also comprise a plurality of first connection surfaces and/or a plurality of second connection surfaces.

For example, the number of first connection surfaces is equal to the number of first contacting surfaces and the number of second connection surfaces is equal to the number of second contacting surfaces.

For fastening the semiconductor bodies, the latter are in each case positioned relative to the semiconductor body mounting regions such that the semiconductor bodies at least sectionally cover the isolation trench of the assigned semiconductor body mounting region in a top view.

The electrically conductive connection between the contacting surfaces and the connection surfaces ensues by a connection layer, for example, such as a solder layer or an electrically conductive adhesive layer.

According to at least one embodiment of the method, said method contains a step in which the carrier composite is singulated into the semiconductor components, wherein each semiconductor component comprises at least one semiconductor body and a carrier having a first carrier body and a second carrier body. The first carrier body and the second carrier body are electrically insulated from one another particularly by the insulation trench. That is, singulation ensues only after fastening the semiconductor bodies to the semiconductor body mounting regions.

The side surfaces bounding the carrier in the lateral direction develop at least sectionally or along the entire circumference of the carrier only upon singulation of the carrier composite. Accordingly, the carrier singulated from the carrier composite, particularly the first carrier bodies and the second carrier bodies, bear traces of the singulation on the side surfaces, for example due to a mechanical singulation method or a chemical singulation method or a singulation method by means of coherent radiation.

According to at least one embodiment of the method, the first contacting surface and the second contacting surface of the carrier composite are in each case short-circuited via the carrier composite when fastening the semiconductor bodies and will be electrically insulated from one another upon singulation. In other words, fastening of the semiconductor bodies is effected in such a way that the first connection surface of the semiconductor body and the second connection surface of the semiconductor body are short-circuited. Only after being singulated, the connection surfaces of the semiconductor body can be electrically contacted separate from one another.

In at least one embodiment of the method, a carrier composite is provided with a plurality of semiconductor body mounting regions, wherein each semiconductor body mounting region comprises at least a first contacting surface and a second contacting surface and an isolation trench is formed in the carrier composite in each semiconductor body mounting region between the first contacting surface and the second contacting surface. A plurality of semiconductor bodies is fastened on the semiconductor mounting regions, wherein a first connection surface of the semiconductor body is electrically conductively connected to the first contacting surface and a second connection surface of the semiconductor body is electrically conductively connected to the second contacting surface, respectively. The carrier composite is singulated into the semiconductor components, wherein each semiconductor component comprises at least one semiconductor body and a carrier having a first carrier body and a second carrier body, in which the first carrier body and the second carrier body are electrically insulated from one another by the isolation trench.

Expediently, the method is performed in the order of the production steps stated above.

According to at least one embodiment of the method, singulation ensues by means of a laser, in particular by means of a pulsed laser. For example, a laser having a pulse duration in the picosecond range, particularly between 1 ps and 100 ps inclusively, may be used.

According to at least one embodiment of the method, the semiconductor bodies are provided in a composite wafer when being fastened on the semiconductor component mounting regions. That is, a plurality of semiconductor bodies can be connected to the respectively assigned semiconductor mounting regions in the carrier composite simultaneously. Singulation of the semiconductor bodies from the composite wafer may only be effected after fastening the semiconductor bodies on the carrier composite, in particular simultaneously when singulating the carrier composite.

According to at least one embodiment of the method, the semiconductor bodies are fastened to the carrier composite separate from one another when being fastened to the semiconductor body mounting regions. That is, the semiconductor bodies are already present in a singulated form in said method step.

The method described is particularly suitable for producing a semiconductor component described above. Features described in conjunction with the semiconductor component may thus also be considered for the method and vice versa.

Further features, designs and expediencies will become apparent from the following description of the exemplary embodiments in conjunction with the Figures.

Figure 1B:
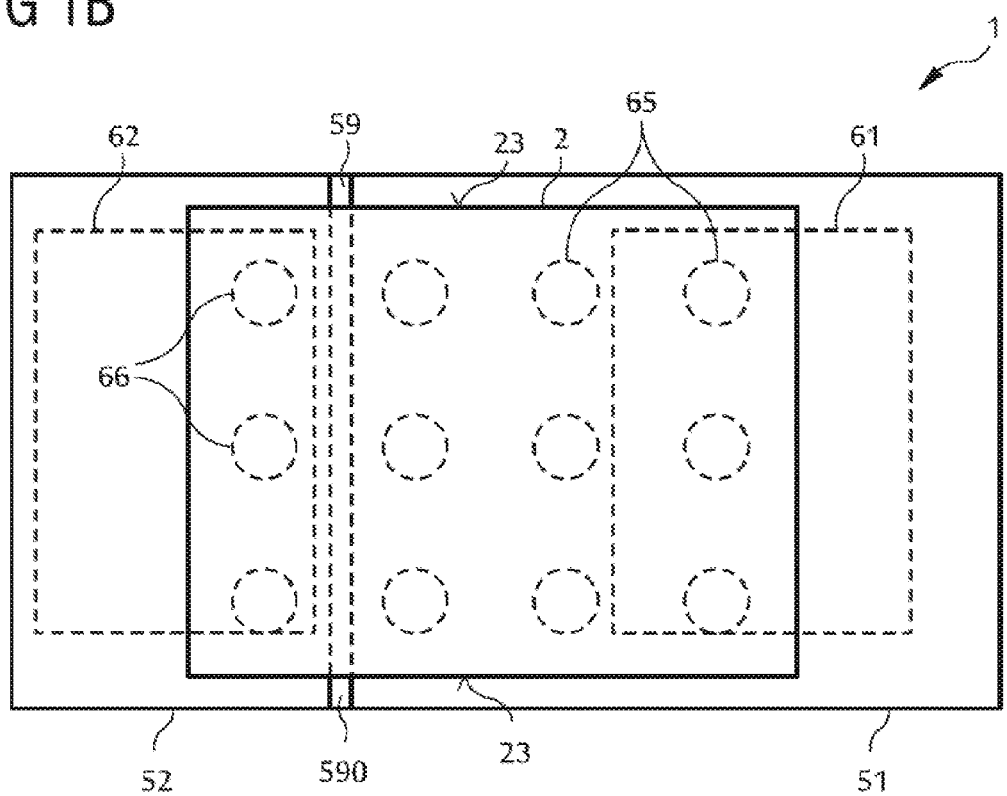
Figure 2:
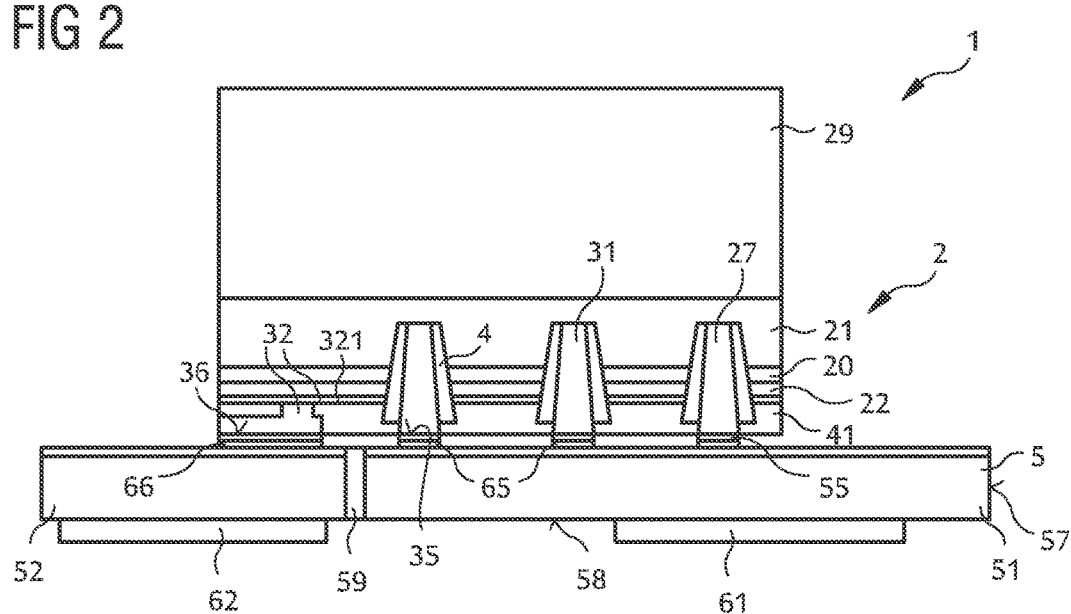
Figure 3A:
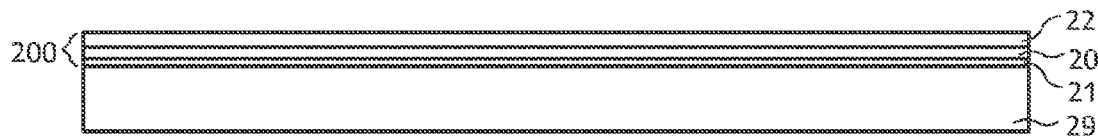
Figure 3B:
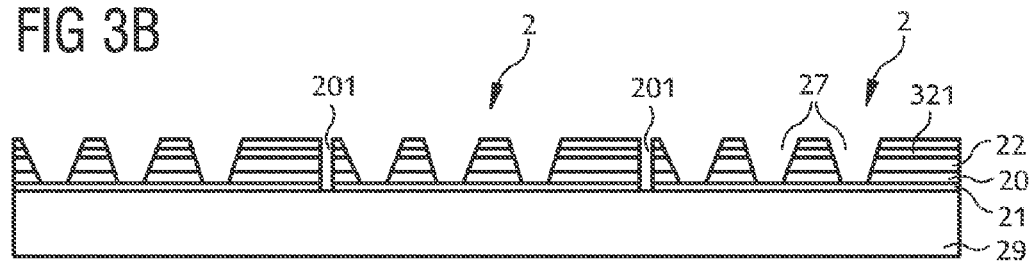
Figure 3C:
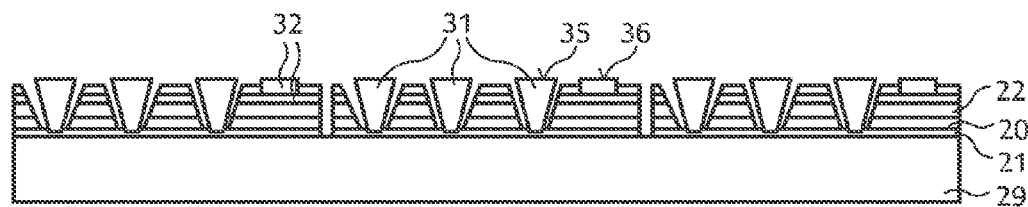
Figure 3D:
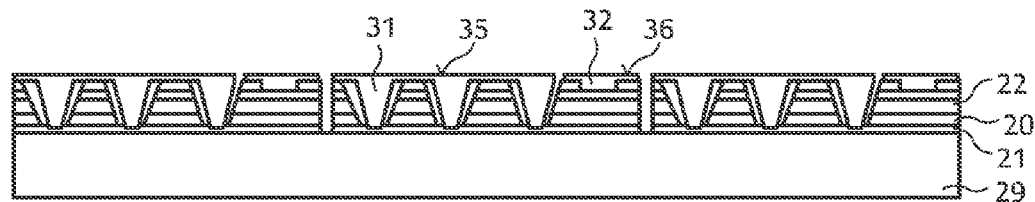
Figure 3E:
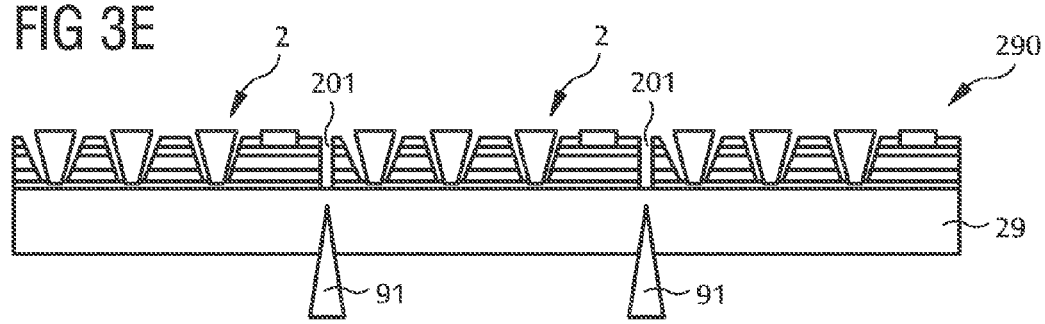
Figure 3F:
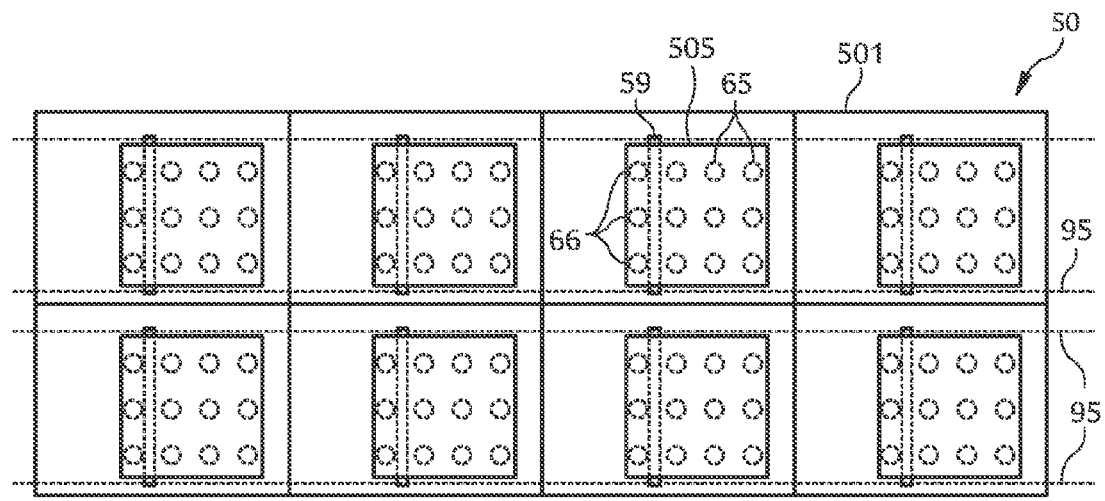

The Figures show in:

FIGS. 1A and 1B a first exemplary embodiment for an optoelectronic semiconductor component in a top view (FIG. 1B) and an associated sectional view (FIG. 1A);

FIG. 2 a second exemplary embodiment for an optoelectronic semiconductor component in a schematic sectional view; and FIGS. 3A to 3G an exemplary embodiment for a method for producing optoelectronic semiconductor components by means of schematically illustrated intermediate steps in a sectional view (FIGS. 3A to 3E and 3G) and in a top view (FIG. 3F).

Like, similar or equivalent elements are provided with the same reference numerals throughout the Figures.

The Figures and the size ratios of the elements illustrated in the Figures are not to be considered as true to scale. Rather, individual elements and in particular layer thicknesses may rather be illustrated in an exaggerated size for illustrative purposes and/or a better understanding.

The semiconductor component 1 according to the exemplary embodiment illustrated in FIGS. 1A and 1B comprises a semiconductor body 2 having a semiconductor layer sequence. Said semiconductor layer sequence comprises an active region 20, which is arranged between a first semiconductor layer 21 and a second semiconductor layer 22. The first semiconductor layer and the second semiconductor layer are different from one another in terms of the conductor type. For example, the first semiconductor layer is n-conducting and the second semiconductor layer is p-conducting, or vice versa. The first semiconductor layer, the second semiconductor layer and the active region may each have a single layer or a multilayer design, respectively. The semiconductor component is exemplified as a luminescence diode, particularly as a light-emitting diode, in which the active region is provided for the generation of radiation. However, the semiconductor component may also be another optoelectronic component, such as radiation receiver.

The semiconductor body 2 is fastened to a carrier 5 by means of a connection layer 55, e.g. a solder layer or an electrically conductive adhesive layer. A gold-tin-solder is suitable for the connection layer, for example.

The semiconductor body, in particular the active region, is based upon a III-V-semiconductor compound material, for example, particularly a nitride semiconductor compound material.

As used herein, "nitride based semiconductor compound material" means that the semiconductor layer sequence or at least a part thereof, particularly preferably at least the active region and/or the growth substrate, comprises a nitride semiconductor compound material, preferably $Al_xIn_xGa_{1-x-y}N$ or consists thereof, with $0 \leq x \leq 1$, $0 \leq y \leq 1$ and $x+y \leq 1$. Said material does not necessarily have to have a mathematically exact composition according to the above formula. It may rather comprise one or more dopants as well as additional constituents, for example. However, for the sake of clarity, the above formula only contains the essential constituents of the crystal lattice (Al, Ga, In, N), even if they can be replaced and/or complemented by small amounts of further substances.

The carrier 5 is divided into a first carrier body 51 and a second carrier body 52. In a top view of the semiconductor component, the first carrier body 51 and the second carrier body 52 run next to one another without overlapping. The first carrier body and the second carrier body are electrically insulated from one another by means of an isolation trench 59. In the top view, the isolation trench projects above the semiconductor body on two opposing side surfaces 23 of the semiconductor body. The isolation trench may be unfilled or at least partially filled with an electrically-insulating filler material 590, for example a polymer material such as an epoxide. For adjustment of the longitudinal expansion coefficient, the material for the filling of the isolation trench may be added with a filler material.

The semiconductor component 1 is designed as a surface-mountable semiconductor component, in which a first contact 61 and a second contact 62 are arranged for the external electrical contacting of the semiconductor component on the rear side 58 of the carrier 5 facing away from the semiconductor body 2. Contacting of the semiconductor component may thus ensue without bonding wire. Furthermore, the semiconductor component per se does not comprise a bonding wire.

In a top view of the semiconductor component 1, the first carrier body and the second carrier body together cover at least 80%, preferably at least 90%, of a base area of the semiconductor component.

Furthermore, the first carrier body and the second carrier body together cover at least 80% of the semiconductor body, preferably at least 90% of the semiconductor body, in a rear view of the semiconductor component. The higher the cover rate, the more efficient loss heat generated during operation of the semiconductor component can be dissipated via the carrier 5.

The carrier 5, particularly the first carrier body 51 and the second carrier body 52 are designed in an electrically conductive manner, in particularly metallic. The charge carriers can be injected through the first carrier body 51 or the second carrier body 52 into the semiconductor body 2 by applying an external electric voltage between the first contact 61 and the second contact 62, so that said charge carriers get into the active region from different sides, recombining there whilst emitting radiation.

In terms of the thermal expansion coefficient, the carrier 5 is preferably adjusted to the thermal expansion coefficient of the semiconductor body 2. Preferably, the thermal expansion coefficient of the carrier deviates from the thermal expansion coefficient of the semiconductor body by no more than 50%. Epitaxially-grown nitride semiconductor compound material typically has a thermal expansion coefficient of around $5.59 \times 10^{-6}$ $K^{-1}$.

The carrier contains molybdenum, for example. Suitable compounds are, for example, Mo-lanthanum oxide, e.g. with 0.3% $La_2O_3$, re-crystallized Mo-lanthanum oxide (MLR), e.g. with 0.7% $La_2O_3$, tension-free lanthanum oxide (MLS), e.g. with 0.7% $La_2O_3$, molybdenum lanthanum oxide in incandescent lamp quality (MoILQ (ILQ=incandescent lamp quality)), e.g. with 0.03% $La_2O_3$, molybdenum yttrium oxide (MY)m e.g. with 0.47% $Y_2O_3$ and 0.08% $Ce_2O_3$, molybdenum rhenium (MoRe), e.g. with 5% rhenium (MoRe5) or with 41% rhenium (MoRe41), molybdenum tungsten (MoW), e.g. with 20% tungsten (MW220), 30% tungsten (MW30) or 50% tungsten (MW50), molybdenum copper (MoCu), e.g. with 30% copper (MoCu30) or 15% copper (MoCu15), molybdenum zirconium dioxide ($MoZrO_2$), e.g. with 1.7% zirconium dioxide (MZ17), molybdenum tantalum (MoTa), e.g. with 11% tantalum (MT11), titanium zirconium molybdenum (TZM), molybdenum hafnium carbon (MHC), molybdenum lanthanum oxide (ML), molybdenum yttrium ceroxide (MY).

As an alternative, the carrier may contain a tungsten alloy or a copper alloy. As a further alternative, the carrier may contain copper, steel, aluminum or iron, for example. Such a carrier may particularly be coated, for example with aluminum, silver or nickel. A copper-nickel coating is particularly suitable.

Ductile, plastically deformable metals or coatings are further suitable for the carrier. As an alternative, a structured metal-plastic-laminate may be further used for the carrier.

In the exemplary embodiment shown, the carrier 5 comprises a coating 53 on the side facing the semiconductor body 2. The coating may particularly serve as a mirror layer for the radiation generated in the active region. Silver, nickel and aluminum are characterized by a high reflectivity in the visible spectral range, for example. However, in contrast thereto, such a coating may also be dispensed with.

A plurality of first contacting surfaces 65 is arranged on the first carrier body 51 on the side facing the semiconductor body 2. The first contacting surfaces are spaced apart from one another in the lateral direction, e.g. arranged in the type of a matrix. The contacting surfaces 65 are electrically conductively connected to one another and to the first contact 61 via the first carrier body 51.

In analogy, the second carrier body 52 comprises a plurality of second contacting surfaces 66 on the side facing the semiconductor body 2. In a top view of the semiconductor component 1, the first contacting surfaces 65 and the second contacting surfaces 66 are separated from one another by the isolation trench 59. The first carrier body 51 and the second carrier body 52 in each case sectionally form a side surface 57 bounding the semiconductor component 1 in the lateral direction.

The semiconductor body 2 comprises a plurality of first connection surfaces 35 on the side facing the carrier 5. The first connection surfaces 35 are electrically conductively connected to the first semiconductor layer 21. The first connection surfaces 35 are arranged spaced apart from one another in the lateral direction and are further arranged such that each first connection surface 35 overlaps with a first contacting surface 65, respectively. Expediently, the number of first connection surfaces 35 is greater or equal to the number of contact surfaces 65 on the carrier 5.

The semiconductor body 2 comprises a plurality of recesses 27, which extend through the second semiconductor layer 22 and the active region 20 into the first semiconductor layer 21. In each recess, the first semiconductor layer 21 is connected to the one of the first connection surfaces 35 via a first connection layer 31. The first connection layer 31 is thus divided into sub-regions spaced apart from one another, said sub-regions only being provided in the region of the recesses 27. In contrast, the first connection layer may also be designed in such a way that the first connection layer interconnects the parts of the first connection layer arranged in the recesses 27 on the side of the semiconductor body 2 facing the carrier 5 (see FIG. 3D).

The side surfaces of the recesses 27 are covered with an insulation layer 4. As a result, an electric short-circuit between the first connection layer 31 and the active region 20 is prevented.

The second connection surface 36 is electrically conductively connected to the second semiconductor layer 22 via a second connection layer 32. In the exemplary embodiment shown, said second connection layer 32 comprises a partial layer 321.

In a top view of the semiconductor component, the partial layer 321 overlaps the first carrier body 51. The partial layer 321 covers the second semiconductor layer 22, except for the recesses 27, in a large area, e.g. with a coverage of at least 60%, preferably of at least 80%. The higher the coverage of the second semiconductor layer 22 the better a charge carrier injection into the second semiconductor layer, homogeneous in the lateral direction, can be achieved.

The partial layer 321 is designed as a mirror layer for the radiation generated in the active region. Preferably, reflectivity of the mirror layer is at least 60%, particularly preferably at least 80% for the radiation generated in the active region. Particularly because of the large-area coverage by means of the partial layer 321, radiation of the semiconductor component radiated in the direction of the carrier 5 can be reflected back in an efficient manner.

In contrast to a reflective design, the partial layer 321 may also be transmissive to the generated radiation. For example, the partial layer may comprise a transparent conductive oxide (TCO, transparent conductive oxide).

The second connection layer 32, particularly the partial layer 321 of the second connection layer, comprises a plurality of cutouts 325, in which the first semiconductor layer 21 is connected to the first carrier body 51 of the carrier via the first connection layer 31. The first connection layer runs in the vertical direction through the cutouts of the second connection layer. In a top view of the semiconductor component, said cutouts 325 overlap with the first carrier body. In the top view, particularly all cutouts run inside the first carrier body. In the sectional view of FIG. 1A, said cutouts 325 are arranged above the first carrier body, particularly above the respective associated first contacting surface 65, in the vertical direction. The cutouts 325 each overlap with the first contacting surfaces 65 and, for the sake of clarity, are not explicitly shown in FIG. 1B.

The second connection surfaces 36 are electrically conductive connected to the second contacting surfaces 66.

On the side facing away from the carrier 5, the semiconductor body 2 is free of metallic elements for the electrical contacting of the semiconductor body. As a result, the risk of a shadowing of the radiation generated in the semiconductor component is prevented. Another insulation layer 41 is arranged between the first connection surfaces 35 and the second connection surfaces 36. A plastic is particularly suitable for the further insulation layer, for example.

In the exemplary embodiment shown, the semiconductor component 1 is designed as a thin film semiconductor component, in which a growth substrate for the semiconductor layer sequence of the semiconductor body 2 is removed. A radiation conversion element 81 is arranged on the side facing away from the carrier 5. The radiation conversion element is provided to convert primary radiation having a first peak wavelength generated in the active region 20 at least partially into secondary radiation having a second peak wavelength different from that of the primary radiation. In particular the semiconductor component 1 is provided for the generation of mixed light, such as light that appears to be white to the human eye.

In the exemplary embodiment shown, the radiation conversion element 81 is fastened to the semiconductor body 2 by means of a fastening layer 82. A ceramic radiation conversion element may be suitable for the radiation conversion element, for example, which is present in the form of a prefabricated plate.

As an alternative, the radiation conversion element may also be formed by a matrix material, with a phosphor being embedded therein for the conversion of radiation. A silicone or an epoxide or a hybrid material including at least one silicone and an epoxide is suitable as the matrix material, for example.

In contrast to the described exemplary embodiment, the radiation conversion element may further also cover the side surfaces of the semiconductor body completely or at least sectionally.

The semiconductor body 2 has a structure 25 on the side facing away from the carrier 5. Said structure is provided for increasing the out-coupling efficiency of the radiation generated during operation. A roughened surface may be suitable as the said structuring.

The first carrier body 51 and the second carrier body 52 each project above the semiconductor body 2 in the lateral direction. Such a design is similar to the course of metal strips of a lead frame. The specific design of the carrier 5 can be varied in a wide range, however.

During manufacture, the side surfaces 57 may develop following singulation of the carrier 5 from a carrier composite. Accordingly, the side surfaces 57 may bear traces of a singulation step, for example traces of a mechanical method, a chemical method or a material removal by means of coherent radiation.

The semiconductor component is characterized by a high mechanical stability and a simple manufacturability at the same time due to the particularly metallic carrier. The electrical contacting of the semiconductor body 2 can ensue through the first carrier body 51 and the second carrier body 52, which is electrically insulated from said first carrier body 51. Elaborate through-connections through the carrier 5 may be omitted. Electrical contacting is rather effected through the material of the carrier bodies separated from one another.

Furthermore, a particularly metallic carrier is characterized by a high thermal conductivity, so that loss heat developing during operation can be dissipated efficiently via the carrier 5.

The second exemplary embodiment illustrated in FIG. 2 essentially corresponds to the first exemplary embodiment described in conjunction with FIGS. 1A and 1B. In contrast, the semiconductor component 1 comprises a growth substrate 29 of the semiconductor layer sequence of the semiconductor body 2. In contrast to the thin film semiconductor component illustrated in FIG. 1A, the growth substrate is not removed. Sapphire may be used as growth substrate, in particular a sapphire substrate having a structured bounding surface to the semiconductor body. The light-out-coupling from the semiconductor component is increased thereby. In this case, the thermal expansion coefficient of the carrier 5 is preferably adjusted to the thermal expansion coefficient of the growth substrate. A sapphire growth substrate typically has a thermal expansion coefficient between 6.5 and 7.5× $10^{-6}$ $K^{-1}$, for example.

One exemplary embodiment for a method for producing semiconductor components is illustrated by FIGS. 3A to 3G wherein a semiconductor component is produced in an exemplary manner, said component being configured as described in conjunction with FIGS. 1A and 1B.

As illustrated in FIG. 3A, a semiconductor layer sequence 200 is provided on a growth substrate 29. The semiconductor layer sequence 200 comprises, viewed from the growth substrate, a first semiconductor layer 21, an active region 20 and a second semiconductor layer 22.

A plurality of recesses 27 is formed from the side facing away from the growth substrate 29, wherein the recesses extend through the active region 20 and the second semiconductor layer 22. Furthermore, semiconductor bodies 2 are formed from the semiconductor layer sequence 200, said bodies being separated from one another by mesa trenches 201. Said mesa trenches separate at least the active regions of the neighboring semiconductor bodies.

FIGS. 3C and 3D illustrate two different variants for the electrical contacting of the first semiconductor layer 21 and the second semiconductor layer 22. In the variant shown in FIG. 3C, a first connection layer 31 is formed such that said layer comprises individual partial regions which are in each case arranged in the recesses 27. The partial regions are spaced apart from one another and electrically conductively connected to one another only via the first semiconductor layer. Furthermore, a second connection layer 32 is formed, said second connection layer being electrically conductively connected to the second semiconductor layer 22. The first connection layer 31 and the second connection layer 32 form an accessible first connection surface 35 or a second connection surface 36, respectively, on the side facing away from the growth substrate.

In contrast, in the variant illustrated in FIG. 3D the first connection layer 31 is formed such that the first connection layer runs continuously on the side of the semiconductor body 2 facing away from the growth substrate 29 and electrically connects the partial regions arranged in the recesses 27. In both variants, the semiconductor bodies 2 provide two connection surfaces of different polarity for the electrical contacting, in each case one connection surface on one side of the semiconductor body.

Subsequently, as illustrated in FIG. 3E, a singulation step is effected, in which the semiconductor bodies 2 are completely separated from one another.

Singulation from the composite wafer 290 ensues along the mesa trenches 201. For example, a mechanical method such a sawing or breaking, and/or irradiation by means of coherent radiation may be suitable for the singulation. A stealth-dicing-method may be used, for example. Singulation is illustrated in FIG. 3E by means of the arrows 91.

After that, the semiconductor bodies 2 are fastened to a carrier composite. The provided carrier composite 50 is shown in FIG. 3F in a top view.

FIG. 3F shows a detail of the carrier composite 50, in which, in an exemplary manner, eight unit cells 501 are arranged next to one another in a matrix type manner. One semiconductor mounting region 505 is arranged in each unit cell. A plurality of first contacting surfaces 65 and second contacting surfaces 66 is assigned to each semiconductor mounting region 505. In each case one isolation trench 59 is arranged between the first contacting surfaces 65 and the second contacting surfaces 66 of a semiconductor mounting region. In the carrier composite 50, the first contacting surfaces 65 and the second contacting surfaces 66 are electrically conductively connected to one another via the carrier composite 50. An electric isolation between the first contacting surfaces 65 and the second contacting surfaces 66 is not effected before singulating the carrier composite 50 along the separation lines 95 illustrated in FIG. 3F, which lines run perpendicularly to a main extension plane of the isolation trenches 59.

For example, the carrier composite may be a sheet, which—except for the isolation trenches—is unstructured and which—except for an optionally filler material present in the isolation trenches—is free of electrically insulating material.

Figure 3G:
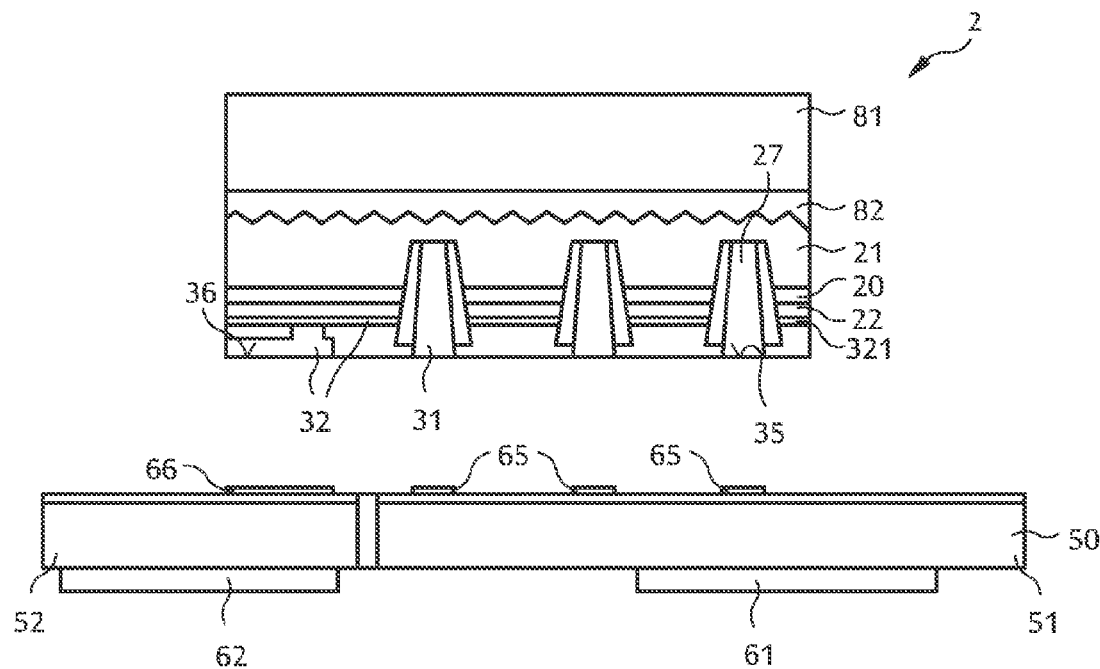

Fastening of the individual semiconductor bodies 2 is illustrated in FIG. 3G. The semiconductor bodies 2 are positioned relative to the carrier composite 50 in such a way that the first connection surfaces 35 overlap with the first contacting surfaces 61 and the second connection surfaces 36 overlap with the second contacting surfaces 62 of a semiconductor mounting region 505. After fastening the semiconductor bodies to the carrier composite 50, said composite is singulated, for example by means of coherent radiation, such as by means of a pulsed laser having a pulse duration in the picosecond range.

When fastening the semiconductor bodies, the first connection surfaces 35 are electrically short-circuited with the second connection surfaces via the carrier composite 50. Only upon singulation along the separation lines 95 (FIG. 3F), they will be electrically insulated from one another. FIG. 3G shows the case that the semiconductor bodies 2 have already been singulated from the composite wafer when being fastened to the carrier composite 50. In contrast, the semiconductor bodies may still be in the composite wafer when being fastened. The growth substrate 29 may be removed prior to or after the fastening to the carrier composite 50 or remain in the finished semiconductor components (see FIG. 2).

Furthermore, the radiation conversion element 81 may also be omitted or only be fastened to or formed on the semiconductor body 2 after fastening the semiconductor body to the carrier composite.

The finished semiconductor component 1 is shown in FIG. 1A in a sectional view. The side surfaces 57 limiting the respective carrier 5 develop during singulation of the carrier composite 50.

The method described allows producing surface mounted semiconductor components with two rear-sided contacts in a simple and reliable manner without that through-connections through the carrier 5 of the semiconductor component be required. For example, the semiconductor bodies may be fastened directly to a carrier in the form of a structured steel sheet, for example soldered.

Electrical separation between the first contact 61 and the second contact 62 ensues via a division of the carrier into two carrier bodies. An electrically insulating coating of the main surfaces of the carrier is not required.

The carrier may be coated with a reflective material, such as silver in order to increase reflectivity of said carrier. For supporting the semiconductor component, in particular in case of a semiconductor component in which the growth substrate is removed, support webs, in particular made of a non-conductive material, can be applied to the carrier. Alternatively or additionally, the radiation conversion element 81 may be configured in a mechanically stable fashion, for example as a ceramic plate.

Mounting the semiconductor components may ensue by means of conventional surface mounting techniques, for example. As an alternative, an inverted surface mounting technique may be used. Such a method is described in patent application DE 10 2013 111 977.8, the content of which is explicitly incorporated herein by reference in this regard.

This patent application claims the priority of German patent application 10 2014 103 828.2, the content of which is incorporated herein by reference.

The invention is not limited by the description in conjunction with the exemplary embodiments. The invention rather comprises any new feature as well as any combination of features, which particularly includes any combination of features in the patent claims, even if said feature or said combination is not explicitly indicated in the patent claims or the exemplary embodiments per se.

The invention claimed is:

1. An optoelectronic semiconductor component with a carrier and a semiconductor body, wherein:
    the semiconductor body is fastened to the carrier and comprises a semiconductor layer sequence with an active region provided for generating and/or receiving radiation, a first semiconductor layer and a second semiconductor layer;
    the active region is arranged between the first semiconductor layer and the second semiconductor layer;
    the carrier is electrically conductive and divided into a first carrier body and a second carrier body, the first carrier body and the second carrier body being electrically insulated from one another;
    the first carrier body comprises a first external contact of the optoelectronic semiconductor component on the side facing away from the semiconductor body, the first external contact being electrically conductively connected to the first semiconductor layer via the first carrier body;
    the second carrier body comprises a second external contact of the optoelectronic semiconductor component on the side facing away from the semiconductor body, the second external contact being electrically conductively connected to the second semiconductor layer via the second carrier body; and
    the first carrier body and the second carrier body are separated from one another by an isolation trench.

2. The optoelectronic semiconductor component according to claim 1, wherein the first carrier body and the second carrier body in a top view of the optoelectronic semiconductor component cover at least 80% of a base area of the optoelectronic semiconductor component.

3. The optoelectronic semiconductor component according to claim 1, wherein the first carrier body and the second carrier body in a rear view of the optoelectronic semiconductor component together cover at least 80% of the semiconductor body.

4. The optoelectronic semiconductor component according to claim 1, wherein
    the first semiconductor layer is arranged on the side of the active region facing away from the carrier;
    the semiconductor body comprises at least one recess, which extends through the second semiconductor layer and the active region into the first semiconductor layer; and
    a first connection layer is arranged in the at least one recess, which layer is electrically conductively connected to the first semiconductor layer.

5. The optoelectronic semiconductor component according to claim 1, wherein the second semiconductor layer is electrically conductively connected to a second connection layer and the second connection layer comprises at least one cut-out, in which the first semiconductor layer is connected to the first carrier body of the carrier via the first connection layer.

6. The optoelectronic semiconductor component according to claim 1, wherein the isolation trench is filled with electrically insulating filler material.

7. The optoelectronic semiconductor component according to claim 1, wherein the carrier is metallic.

8. The optoelectronic semiconductor component according to claim 1, wherein a thermal expansion coefficient of the carrier deviates from the thermal expansion coefficient of the semiconductor body by 50% at most.

9. An optoelectronic semiconductor component with a carrier and a semiconductor body, wherein:
    the semiconductor body is fastened to the carrier and comprises a semiconductor layer sequence with an active region provided for generating and/or receiving radiation, a first semiconductor layer and a second semiconductor layer, wherein
    the active region is arranged between the first semiconductor layer and the second semiconductor layer;
    the carrier is electrically conductive and divided into a first carrier body and a second carrier body, the first carrier body and the second carrier body being electrically insulated from one another;
    the first carrier body comprises a first external contact of the optoelectronic semiconductor component on the side facing away from the semiconductor body, the first external contact being electrically conductively connected to the first semiconductor layer via the first carrier body;
    the second carrier body comprises a second external contact of the optoelectronic semiconductor component on the side facing away from the semiconductor body, the second external contact being electrically conductively connected to the second semiconductor layer via the second carrier body;
    the second semiconductor layer is connected to the second carrier body via a second connection layer;
    the second connection layer comprises a plurality of cut-outs, the first semiconductor layer being connected to the first carrier body via a first connection layer in the cut-outs;
    all cut-outs run inside the first carrier body in a top view of the optoelectronic semiconductor component; and
    the first carrier body and the second carrier body are separated from one another by an isolation trench.

* * * * *